(12) United States Patent
Nozoe et al.

(10) Patent No.: US 7,903,385 B2
(45) Date of Patent: Mar. 8, 2011

(54) STATIC ELECTRICITY CONTROL PART AND PROCESS FOR MANUFACTURING THE SAME

(75) Inventors: Kenji Nozoe, Fukui (JP); Takeshi Iseki, Fukui (JP); Takashi Morino, Fukui (JP); Kouichi Yoshioka, Kyoto (JP); Hideaki Tokunaga, Osaka (JP)

(73) Assignee: Panasonic Corporation, Osaka (JP)

( * ) Notice: Subject to any disclaimer, the term of this patent is extended or adjusted under 35 U.S.C. 154(b) by 146 days.

(21) Appl. No.: 12/517,605

(22) PCT Filed: Dec. 4, 2007

(86) PCT No.: PCT/JP2007/073375
§ 371 (c)(1),
(2), (4) Date: Jun. 4, 2009

(87) PCT Pub. No.: WO2008/069190
PCT Pub. Date: Jun. 12, 2008

(65) Prior Publication Data
US 2010/0067163 A1    Mar. 18, 2010

(30) Foreign Application Priority Data
Dec. 7, 2006   (JP) .................................. 2006-330197

(51) Int. Cl.
*H02H 1/00*   (2006.01)
(52) U.S. Cl. ........................................ 361/220; 361/212
(58) Field of Classification Search .................. 361/212, 361/220, 225
See application file for complete search history.

(56) References Cited

U.S. PATENT DOCUMENTS

| | | | | |
|---|---|---|---|---|
| 5,357,662 A | * | 10/1994 | Takagi et al. | ................. 29/25.35 |
| 6,191,928 B1 | | 2/2001 | Rector et al. | |
| 6,744,179 B2 | * | 6/2004 | Wajima et al. | ................. 310/344 |
| 2005/0195549 A1 | | 9/2005 | Inoue et al. | |

FOREIGN PATENT DOCUMENTS

| | | |
|---|---|---|
| JP | 61-102006 | 5/1986 |
| JP | 62-144303 | 6/1987 |
| JP | 11-102839 | 4/1999 |
| JP | 2000-188368 | 7/2000 |
| JP | 2003-297606 | 10/2003 |
| JP | 2005-203479 | 7/2005 |

OTHER PUBLICATIONS

International Search Report issued Jan. 15, 2008 in the International (PCT) Application of which the present application is the U.S. National Stage.

* cited by examiner

*Primary Examiner* — Danny Nguyen
(74) *Attorney, Agent, or Firm* — Wenderoth, Lind & Ponack, LLP.

(57) ABSTRACT

The static-electricity control part of the present invention contains multiple pairs of backside electrodes (13) provided on both end portions (11b) of a long-edge-side at the backside of insulating substrate (11); multiple pairs of top electrodes (18) provided on both end portions (11c) of a long-edge-side at the top face of insulating substrate (11); top ground electrode (17) provided on the top face of insulating substrate (11) from its short-edge-side one end portion (11a) to other end portion (11b); overvoltage protection material layer (22) for filling gap (19) formed between any one of the multiple pair pairs of top electrodes (18) and top ground electrode (17); and backside wiring (14) provided on the backside of insulating substrate (11) so as to connect between the multiple pairs of backside electrodes (13).

4 Claims, 9 Drawing Sheets

STATIC ELECTRICITY CONTROL PART AND PROCESS FOR MANUFACTURING THE SAME

TECHNICAL FIELD

The present invention relates to a static-electricity control part for protecting electronic equipment from static damage, particularly relates to a multiterminal-type static-electricity control part used for multiple circuits, which protects an integrated circuit from static damage.

BACKGROUND ART

In recent years, mobile phones and other electronic devices have become more compact and powerful, which also accelerates size reductions of electronic parts used for the electronic devices. The miniaturization inconveniently decreases a withstand voltage of electronic devices and parts, which often causes damage to electric circuits in an electronic device due to electrostatic pulses generated when a terminal of the device makes contact with the human body. The generation of the electrostatic pulses allows high-voltage pulses—ranging from few hundreds of volts to few kilovolts with a rise time shorter than one nanosecond—to be applied to electric circuits in the device.

To address the problem of the electrostatic pulses, in conventional cases, a static-electricity control part is disposed between a line having static electricity and ground. However, recent technology achieves transmission rates of signal lines higher than few hundreds Mbps. Under the circumstances, a static-electricity control part with large capacitance causes degradation in signal quality. It is therefore preferable that the capacitance of a static-electricity control part should be kept smaller as possible. It becomes necessary to prepare a static-electricity control part with capacitance smaller than 1 pF for high transmission rates beyond few hundreds Mbps.

To address the problem of static electricity in a high-speed transmission line, a plurality of static-electricity control parts are conventionally used for protecting an integrated circuit having multiple signal terminals and ground terminals from static damage. However, using more-than-one static-electricity control parts has inconveniently increased the mounting process for integrated circuit implementation.

To decrease the mounting process for an integrated circuit, there is a growing demand that a plurality of static-electricity control parts are integrated into a single chip according to the arrangement sequence and spacing of the signal terminals and the ground terminals of an integrated circuit.

For example, patent document 1 below is known as the prior art relating to the present invention.

According to the conventional static-electricity control part described in patent document 1, as is shown in FIG. 10, common electrode 1 and a plurality of top electrodes 2 are formed, with gap 3 provided therebetween, on the top face of insulating substrate 4. Common electrode 1 is connected to the ground terminal of an integrated circuit; on the other hand, top electrodes 2 are connected to a plurality of signal terminals of the integrated circuit. The space formed between top electrodes 2 and gap 3 formed between common electrode 1 and top electrodes 2 are filled with overvoltage protection material layer 5.

Hereinafter will be described mechanism for exhibiting characteristics of the aforementioned static-electricity control part where gap 3 between top electrodes 2 and common electrode 1 is filled with overvoltage protection material layer 5.

That is, when overvoltage caused by static electricity is applied to gap 3 between top electrodes 2 and common electrode 1, "discharge current" flows between conductive particles or semiconductive particles scattered in overvoltage protection material layer 5 disposed in gap 3 between top electrodes 2 and common electrode 1. Current flows between the conductive particles or the semiconductive particles scattered in overvoltage protection material layer 5, making a detour as a scattered flow—with no concentration at a specific place—to the ground terminal.

According to the conventional static-electricity control part described in patent document 1, the space between top electrodes 2 is filled with overvoltage protection material layer 5. The structure above easily causes crosstalk between adjacent signal terminals. Besides, the conventional structure above has a small contact area of alumina-made insulating substrate 4 and a protection resin layer, by which the protection resin layer has insufficient adhesion strength, resulting in poor reliability. Further, using a high amount of overvoltage protection material layer 5 has been an obstacle to cost reduction.

patent document 1: Japanese Unexamined Patent Application Publication No. 2000-188368

SUMMARY OF THE INVENTION

To address the conventional problems above, the present invention provides a multiterminal-type static-electricity control part used for multiple circuits, which has little effect from crosstalk between adjacent signal terminals and therefore offers high reliability, and also provides the process for manufacturing the static-electricity control part.

To attain above, the present invention provides a static-electricity control part having the structure below.

The static-electricity control part of the present invention contains multiple pairs of backside electrodes provided on both end portions of a long-edge-side at the backside of an insulating substrate; multiple pairs of top electrodes provided on both end portions of a long-edge-side at the top face of the insulating substrate; multiple pairs of edge electrodes provided on an edge of the insulating substrate so as to connect electrically between the multiple pairs of top electrodes and the multiple pairs of backside electrodes; a top ground electrode provided on the top face of the insulating substrate from its short-edge-side one end portion to other end portion; a pair of edge ground electrodes provided on an edge of the insulating substrate and electrically connected to the top ground electrode; a gap formed between any one of the multiple pairs of top electrodes and the top ground electrode; an overvoltage protection material layer for filling the gap; a top-face protection resin layer for completely covering the overvoltage protection material layer; and a backside wiring provided on the backside of the insulating substrate so as to connect between the multiple pairs of backside electrodes.

When multiple top electrodes are connected to multiple signal terminals of an integrated circuit, the structure above suppresses crosstalk effect between adjacent signal terminals. Therefore, such structured multiterminal-type static-electricity control part used for multiple circuits maintains high signal quality and reliable operations even in a high-frequency circuit.

Besides, the structure has an increased contact area between the insulating substrate and the top-face protection resin layer. This allows the top-face protection resin layer to be in further closely contact with the insulating substrate, improving reliability of the static-electricity control part.

The process for manufacturing the static-electricity control part of the present invention has the following steps: printing and baking multiple pairs of backside electrodes on both end portions of a long-edge-side at the backside of an insulating substrate; forming a conductor predominantly composed of gold on the top face of the insulating substrate; removing an unnecessary portion of the conductor for forming multiple pairs of top electrodes provided at both end portions of a long-edge-side of the top face of the insulating substrate and for forming a top ground electrode provided on the top face of the insulating substrate from its short-edge-side one end portion to other end portion so as to face, via a gap, any one of the multiple pairs of top electrodes; forming an overvoltage protection material layer for filling the gap; forming a top-face protection resin layer for completely covering the overvoltage protection material layer; forming an edge electrode on an edge of the insulating substrate so as to electrically connect between the multiple pairs of top electrodes and the multiple pairs of backside electrodes; forming an edge ground electrode on an edge of the insulating substrate so as to be electrically connected to the top ground electrode; and forming a backside wiring on the backside of the insulating substrate so as to connect between the multiple pairs of backside electrodes.

According to the manufacturing process above, when multiple top electrodes are connected to multiple signal terminals of an integrated circuit, the structure formed through the steps above suppresses crosstalk effect between adjacent signal terminals. Therefore, such structured multiterminal-type static-electricity control part used for multiple circuits maintains high signal quality and reliable operations even in a high-frequency circuit.

Besides, the structure formed through the steps above has an increased contact area between the insulating substrate and the top-face protection resin layer. This allows the top-face protection resin layer to be in further closely contact with the insulating substrate, improving reliability of the static-electricity control part.

Figure 1A:
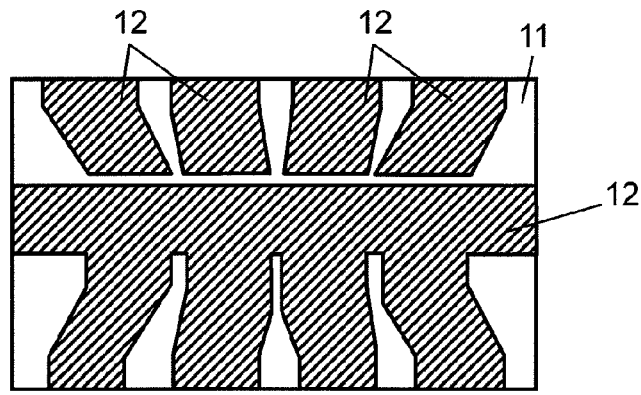
FIG. 1A is a plan view showing a step of the process for manufacturing a static-electricity control part in accordance with a first exemplary embodiment of the present invention.

REFERENCE MARKS IN THE DRAWINGS 11, 41 insulating substrate
11*a*, 41*a* one end portion (end portion)
11*b*, 41*b* other end portion (end portion)
11*c*, 41*c* long-edge-side both end portions
12, 46 conductor
13, 42 backside electrode
14, 43 backside wiring
15, 44 backside ground electrode
16 resist
17, 47 top ground electrode
18, 45, 45*a*, 45*b*, 45*c*, 45*d* top electrode
19, 48 gap
20, 49 overlaid top electrode 21, 50 backside protection resin layer
22, 51 overvoltage protection material layer
23 top-face protection resin layer
24 imprint resin layer
25 edge ground electrode
26 edge electrode
27 integrated-circuit element
28 circuit board
29 wiring pattern
30 signal terminal
31 ground terminal
52 resistor

DETAILED DESCRIPTION OF THE PREFERRED EMBODIMENTS

Hereinafter will be described an exemplary embodiment of the present invention with reference to drawings. For making the structure easier to understand, dimensions are enlarged throughout the drawings. In addition, like parts have similar reference marks in the drawings and the description thereof may be omitted.

First Exemplary Embodiment

Hereinafter will be described a process for manufacturing a static-electricity control part in accordance with the first exemplary embodiment of the present invention with reference to drawings.

Each of FIGS. 1A through 1C, 2A through 2C, and 3A through 3C is a plan view showing a step of the process for manufacturing a static-electricity control part in accordance with the first exemplary embodiment of the present invention. FIG. 4 is a perspective view showing a step of the process for manufacturing the static-electricity control part in accordance with the first exemplary embodiment of the present invention. FIGS. 1A through 1C, 2A through 2C, and 3A through 3C show a top view or a backside view of a partly-finished each piece to be formed into a multiterminal-type static-electricity control part for multiple circuits. In a real-world manufacturing process, however, aforementioned each piece is the one of a series of partly-finished pieces arranged in a matrix on a sheet-like insulating substrate.

Insulating substrate 11 shown in FIG. 1A is so structured that alumina or other low-dielectric materials having a dielectric constant lower than 50, preferably lower than 10 is baked at, for example, a temperature in the range of 900° C. to 1600° C. FIG. 1A shows a step where conductor 12 is formed by screen-printing and baking gold resinate paste on the top face of insulating substrate 11. The thickness of conductor 12 after baking is, for example, in the range of 0.2 μm to 2.0 μm. The thin structure of conductor 12 protects metal including conductor 12 to be formed into an electrode from having burrs, offering consistent dimensions and shapes.

Figure 1B:
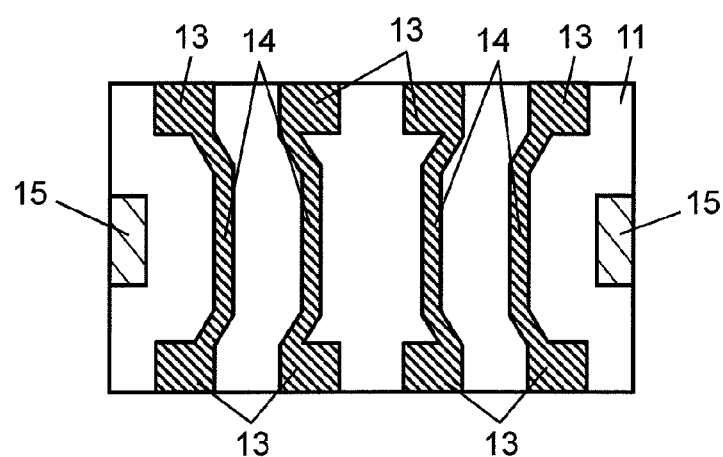
FIG. 1B is a plan view showing a step of the process for manufacturing the static-electricity control part in accordance with the first exemplary embodiment of the present invention.

Next, FIG. 1B shows a step where backside electrodes 13, backside wiring 14 and backside ground electrode 15 are formed by screen-printing and baking silver paste or silver-palladium paste on the backside of insulating substrate 11. Although backside electrodes 13, backside wiring 14 and backside ground electrode 15 are formed by screen-printing and baking with the use of silver paste or silver-palladium paste in the step above, it is not limited to; they may be formed by printing and baking a material predominantly composed of gold, such as gold resinate paste, on the insulating substrate. However, in a case where a material predominantly composed of gold is employed for backside electrodes 13, backside wiring 14 and backside ground electrode 15, gold as the material of the electrodes and wiring above forms alloy with solder, resulting in decrease in contained amount of gold in the electrodes and wiring (hereinafter, the phenomenon is referred to solder leach of gold). To address the solder leach of gold, an overlaid backside electrode (not shown) is formed over backside electrodes 13 and backside ground electrode 15. The overlaid backside electrode, which is made of mixture paste of curing resin and silver, protects gold contained in backside electrodes 13 and backside ground electrode 15 from solder leach.

Figure 1C:
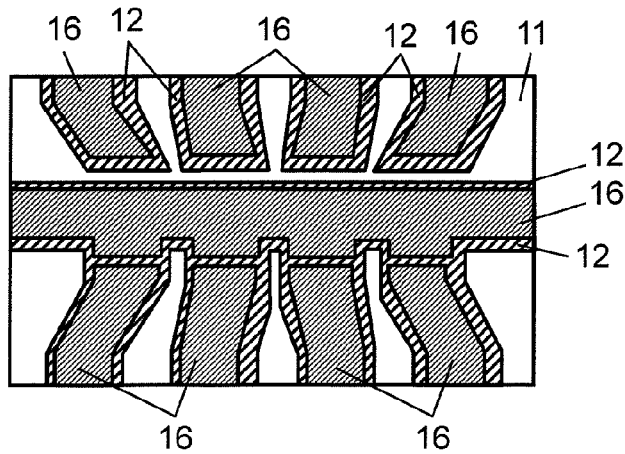
FIG. 1C is a plan view showing a step of the process for manufacturing the static-electricity control part in accordance with the first exemplary embodiment of the present invention.

Next, FIG. 1C shows a step where photo sensitive resist 16 is applied to the top face of insulating substrate 11. Resist 16 undergoes exposure via a mask pattern (not shown) and an unnecessary portion of exposed resist 16 is removed by developing. Through the step, the pattern for a top ground electrode and multiple pairs of top electrodes is formed on resist 16.

Figure 2A:
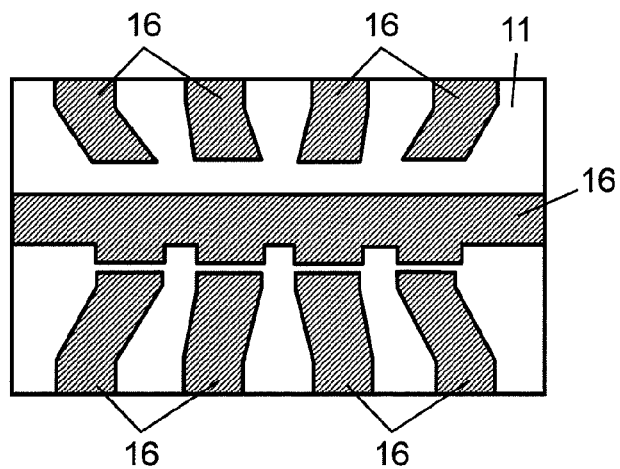
FIG. 2A is a plan view showing a step of the process for manufacturing the static-electricity control part in accordance with the first exemplary embodiment of the present invention.
Figure 2B:
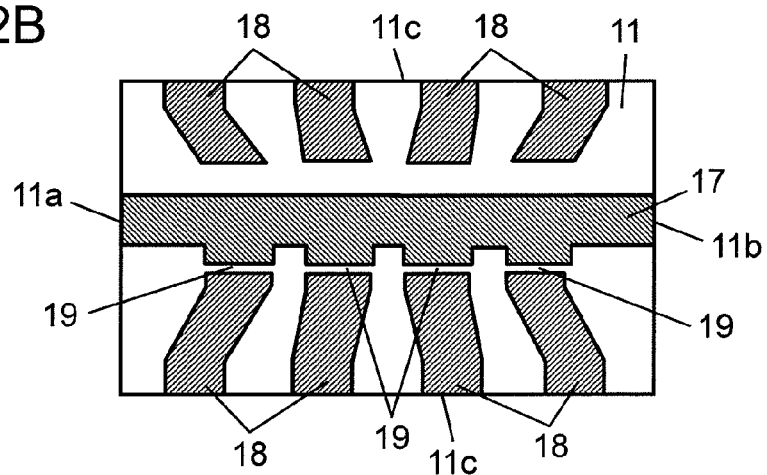
FIG. 2B is a plan view showing a step of the process for manufacturing the static-electricity control part in accordance with the first exemplary embodiment of the present invention.

Next, as shown in FIGS. 2A and 2B, insulating substrate 11, on which the pattern for a pair of top ground electrodes 17 and multiple pairs of top electrodes 18 is formed, undergoes etching, so that an unnecessary portion of conductor 12 shown in FIG. 1C is removed. Through the step above, top ground electrode 17, multiple pairs of top electrodes 18, and gap 19 are formed on insulating substrate 11. Top ground electrode 17 runs from short-edge-side one end portion 11a through a middle portion to other end portion 11b. The multiple pairs of top electrodes 18 are located on long-edge-side both end portions 11c. Gap 19, which has a width of approx. 10 μm, is formed between any one of the multiple pairs of top electrodes 18 and top ground electrode 17. In a case where backside electrode 13, backside wiring 14, and backside ground electrode 15 are formed of a material that is easily corroded by an etching liquid, the backside of insulating substrate 11 undergoes masking with a resist or the like prior to etching. This protects the electrodes and wiring from corrosion.

Figure 2C:
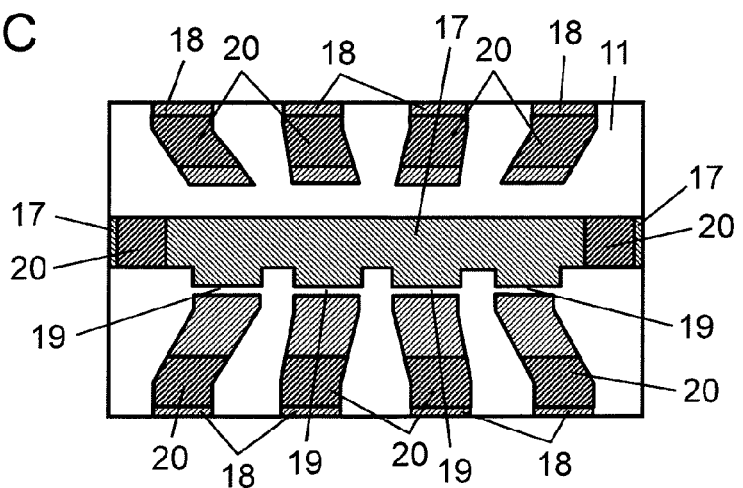
FIG. 2C is a plan view showing a step of the process for manufacturing the static-electricity control part in accordance with the first exemplary embodiment of the present invention.

Next, FIG. 2C shows a step where overlaid top electrode 20 made of mixture paste of resin and silver is formed with a thickness, for example, in the range of 3 μm to 20 μm, by screen-printing so as to cover a part of top ground electrode 17 and top electrodes 18 and so as not to cover the edges (not shown) of insulating substrate 11. The printed mixture paste is dried at a temperature in the range of 100° C. to 200° C. for a period in the range of 5 to 15 minutes. Such structured overlaid top electrode 20 is formed for protecting top ground electrode 17 and top electrodes 18 predominantly composed of gold from solder leach. Overlaid top electrode 20 is formed on the insulating substrate so as not to cover the edges that serve as a first dividing line and a second dividing line and the periphery of the edges of the substrate. The first and the second dividing lines are orthogonal scribe lines used when the sheet-like insulating substrate, on which multiple pieces are arranged in a matrix, is divided into each single piece.

Figure 3A:
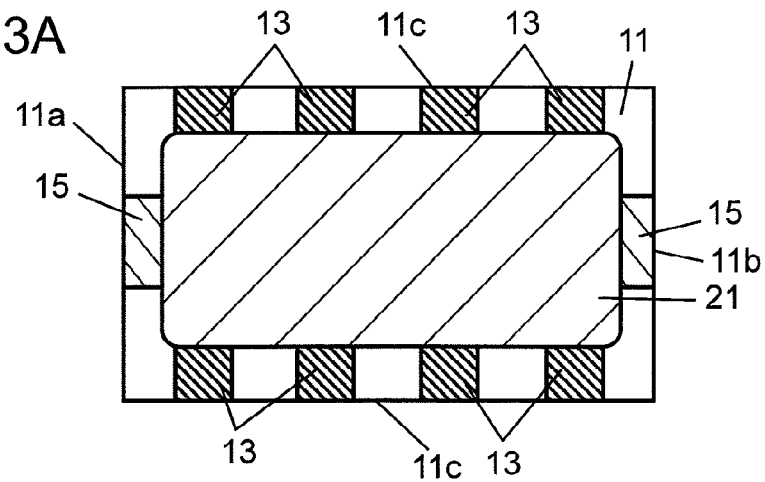
FIG. 3A is a plan view showing a step of the process for manufacturing the static-electricity control part in accordance with the first exemplary embodiment of the present invention.
Figure 4:
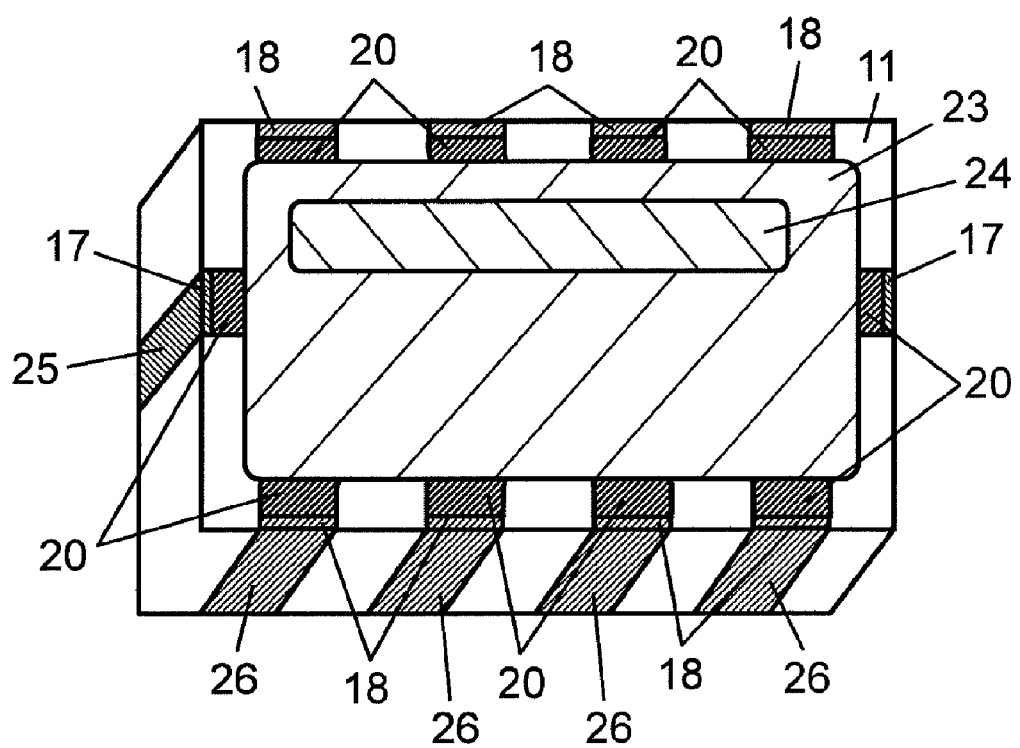
FIG. 4 is a perspective view showing a step of the process for manufacturing the static-electricity control part in accordance with the first exemplary embodiment of the present invention.

FIG. 3A shows a step where backside protection resin layer 21 is formed on the backside of insulating substrate 11 by printing so as to completely cover backside wiring 14 (not shown).

Figure 3B:
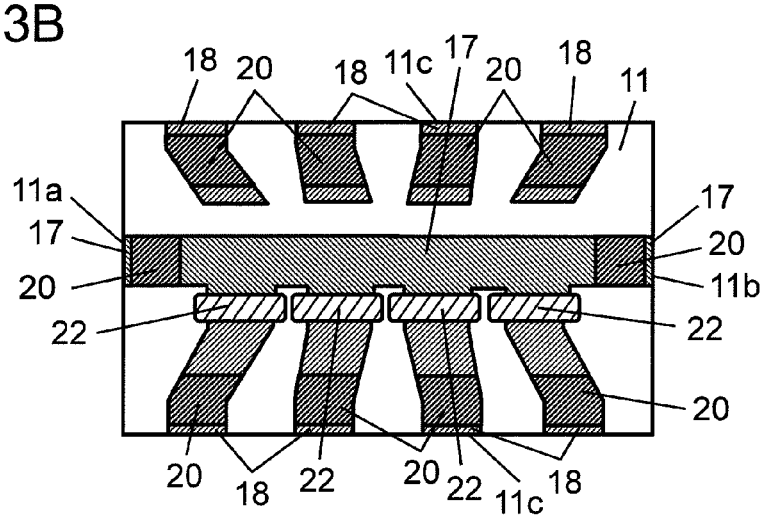
FIG. 3B is a plan view showing a step of the process for manufacturing the static-electricity control part in accordance with the first exemplary embodiment of the present invention.

FIG. 3B shows a step where overvoltage protection material paste is applied onto the top face of insulating substrate 11 so as to cover the gap (not shown), top electrodes 18, and top ground electrode 17. The paste is formed, by screen-printing, into a thickness ranging, for example, from 5 μm to 50 μm. At the same time, the printed paste is dried at a temperature in the range of 150° C. to 200° C. for a period in the range of 5 to 15 minutes. Such formed overvoltage protection material layer 22 is separately disposed on each of top electrodes 18. The overvoltage protection material paste, which is formed into overvoltage protection material layer 22, is formed as follows: preparing a mixture of a metallic powder, which is formed of at least any one of Ni, Al, Ag, Pd and Cu, with an average particle diameter ranging from 0.3 µm to 10 µm and a spherical shape, and silicone-based resin such as methyl silicone; adding a suitable organic solvent to the mixture and kneading it well by a triple roll mill. In the step above, an intermediate layer (not shown), which has almost equal size to overvoltage protection material layer 22 disposed over gap 19 so as to completely cover layer 22, may be formed. In that case, intermediate-layer paste made of an insulating particle and methyl silicone is printed by screen-printing and dried. Preferably, the total thickness after drying of overvoltage protection material layer 22 and the intermediate layer should be 30 µm or greater so that electrostatic resistance satisfies predetermined conditions.

Figure 3C:
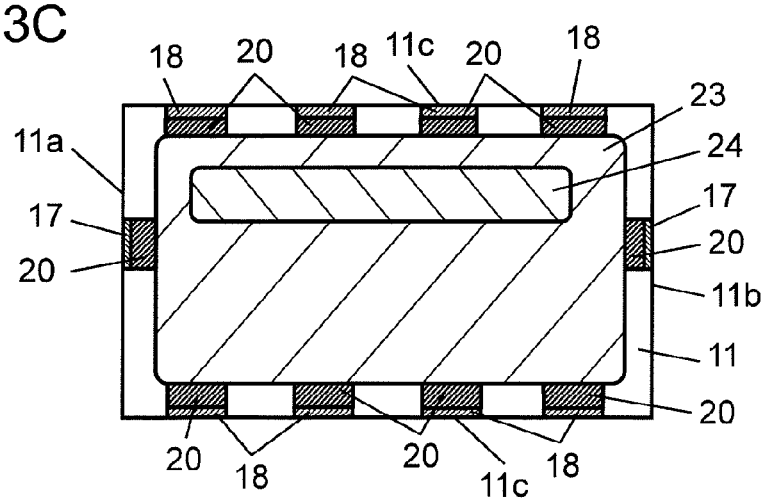
FIG. 3C is a plan view showing a step of the process for manufacturing the static-electricity control part in accordance with the first exemplary embodiment of the present invention.

FIG. 3C shows a step for forming top-face protection resin layer 23. Top-face protection resin layer 23 completely covers top ground electrode 17—except for a part of top ground electrode 17 on edge portions 11a, 11b—and overvoltage protection material layer 22, with top electrodes 18 and overlaid top electrodes 20 partly exposed. To form top-face protection resin layer 23, protection resin paste made of epoxy resin, phenol resin and the like is printed by screen-printing. At the same time, the printed paste is dried at a temperature in the range of 100° C. to 150° C. for a period in the range of 5 to 15 minutes. After that, the paste is cured at a temperature in the range of 150° C. to 200° C. for a period in the range of 15 to 60 minutes. Top-face protection resin layer 23 is thus formed. Top-face protection resin layer 23 not only protects a function element formed on the top face of insulating substrate 11 but also enhances adhesion strength between insulating substrate 11 and overvoltage protection material layer 22, providing stability in characteristics. Disposed on overvoltage protection material layer 22, top-face protection resin layer 23 has a thickness after drying in the range of, for example, 15 µm to 35 µm.

In the step above, as shown in FIGS. 3B and 3C, imprint resin layer 24 may be formed on top-face protective resin layer 23 at a position above a gap between top ground electrode 17 and top electrodes 18 on the side of having no overvoltage protection material layer 22. Forming imprint resin layer 24 allows the top face of insulating substrate 11 to be on a level with the elevation of the face caused by overvoltage protection material layer 22 disposed therebeneath. By virtue of its flat top face, the static-electricity control part is tightly held by a mounting nozzle and is mounted on a circuit board in a stable condition. Besides, forming imprint resin layer 24 in a color different from that of top-face protection resin layer 23 allows the orientation of top electrodes 18 to be easily found, enhancing rationalization of an inspecting process.

FIG. 4 shows a step where sheet-like insulating substrate 11 is divided into each piece by dicing and then edge ground electrode 25 and edge electrodes 26 are formed on the piece. To form edge ground electrode 25, conductive paste predominantly composed of curing resin and silver is applied to the piece and is cured by drying. Edge ground electrode 25 establishes electrical connections between top ground electrode 17 and backside ground electrode 15 (not shown). After that, to form edge electrodes 26, conductive paste predominantly composed of curing resin and silver is applied to the piece and is cured by drying. Edge electrodes 26 connect electrically between top electrodes 18 and backside electrodes 13 (not shown). Further, a nickel-plated layer (not shown) and a tinned layer (not shown) are formed by barrel plating in such a way that top ground electrode 17, top electrodes 18, overlaid top electrode 20, edge ground electrode 25, and edge electrodes 26 are covered with the nickel-plated layer; and the nickel-plated layer is covered with the tinned layer. Such structured each piece undergoes finished products inspection. The static-electricity control part of the first exemplary embodiment is thus obtained.

Figure 5:
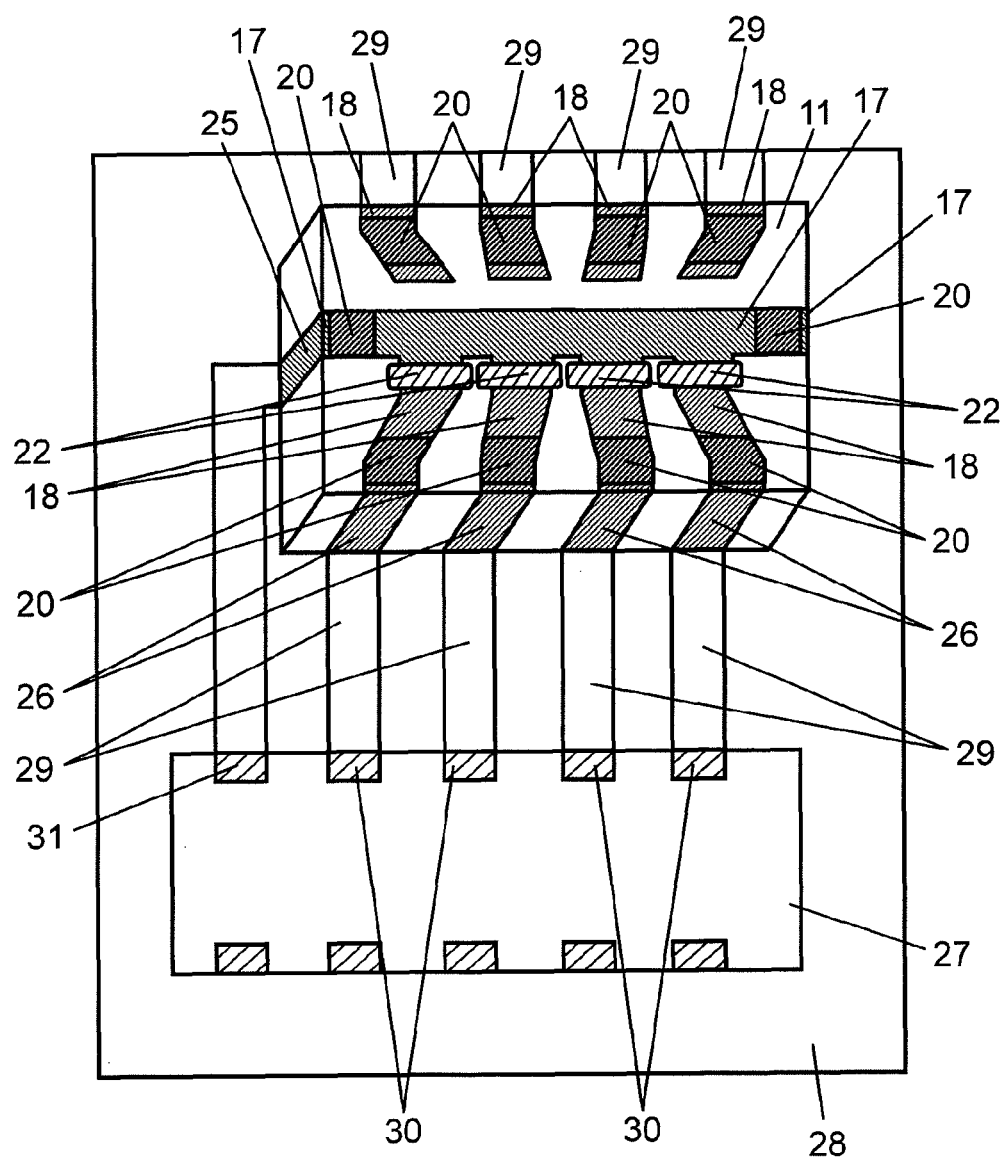
FIG. 5 is a perspective view illustrating the operating principle of the static-electricity control part in accordance with the first exemplary embodiment of the present invention.

FIG. 5 is a perspective view showing the state where the static-electricity control part of the first exemplary embodiment and integrated-circuit element 27 are mounted on circuit board 28.

The static-electricity control part of the first exemplary embodiment, as shown in FIGS. 3A through 3C and 5, has the following components: multiple pairs of backside electrodes 13 provided on both end portions 11c of a long-edge-side at the backside of insulating substrate 11; multiple pairs of top electrodes 18 provided on both end portions 11c of a long-edge-side at the top face of insulating substrate 11; multiple pairs of edge electrodes 26 provided on an edge of insulating substrate 11, which connect electrically between the multiple pairs of top electrodes 18 and the multiple pairs of backside electrodes 13; top ground electrode 17 provided on the top face of insulating substrate 11 from its short-edge-side one end portion 11a through a middle portion to other end portion 11b; a pair of edge ground electrodes 25 provided on an edge of insulating substrate 11 and electrically connected to top ground electrode 17; gap 19 formed between any one of the multiple pairs of top electrodes 18 and top ground electrode 17; overvoltage protection material layer 22 for filling gap 19; top-face protection resin layer 23 for completely covering overvoltage protection material layer 22; and backside wiring 14 provided on the backside of insulating substrate 11 so as to connect between the multiple pairs of backside electrodes 13.

When the multiple pairs of top electrodes 18 are connected to multiple signal terminals of an integrated circuit, the aforementioned structure, since adjacent signal terminals are separated and overvoltage protection material layer 22 is individually formed for each signal terminal, suppresses crosstalk effect. Therefore, such structured multiterminal-type static electricity control part used for multiple circuits maintains high signal quality and reliable operations even in a high-frequency circuit.

Besides, the structure above has an increased contact area between insulating substrate 11 and top-face protection resin layer 23. This allows top-face protection resin layer 23 to be in further closely contact with insulating substrate 11, improving reliability of the static-electricity control part.

Next will be described the operating principle of the static-electricity control part of the first exemplary embodiment with reference to FIG. 5. FIG. 5 is a perspective view, seen from above, of the static-electricity control part of the first exemplary embodiment. For the sake of explanation, top-face protection resin layer 23 and imprint resin layer 24 are omitted from the drawing.

When integrated-circuit element 27 operates under normal conditions (i.e., under rated voltage), as is apparent from FIG. 5, top electrodes 18 and top ground electrode 17 maintain electrically opened conditions therebetween. This is because of the insulation property of silicone-based resin that forms overvoltage protection material layer 22 disposed at gap 19 (not shown) between top electrodes 18 and top ground electrode 17. Therefore, a signal from integrated-circuit element 27 is transmitted through wiring pattern 29 on circuit board 28 and backside wiring 14 (not shown) on the backside of the static-electricity control part. However, if high voltage, such as an electrostatic pulse, is applied to at least any one of signal terminals 30 of integrated-circuit element 27, discharge current is generated between metallic particles via silicone-based resin on overvoltage protection material layer 22, resulting in significant decrease in impedance. In response to the decrease in impedance, the static-electricity control part of the embodiment leads abnormal voltage, such as electrostatic pulses and surges, from wiring pattern 29 through edge electrodes 26, top electrodes 18, overvoltage protection material layer 22, top ground electrode 17, edge ground electrode 25 to ground terminal 31. In this way, the static-electricity control part protects integrated-circuit element 27 from damage.

According to the aforementioned static-electricity control part of the embodiment, overvoltage protection material layer 22 is separately disposed on each of multiple top electrodes 18. When multiple top electrodes 18 are connected to multiple signal terminals of integrated-circuit element 27, the structure above suppresses crosstalk effect between adjacent signal terminals. Therefore, such structured multiterminal-type static-electricity control part for multiple circuits maintains high signal quality and reliable operations even in a high-frequency circuit.

Compared to the conventional structure where overvoltage protection material layer 22 is provided between multiple top electrodes 18, the structure of the embodiment has an increased contact area between insulating substrate 11 and top-face protection resin layer 23. This allows top-face protection resin layer 23 to be in further closely contact with insulating substrate 11, improving reliability of the static-electricity control part.

Besides, the static-electricity control part has wiring pattern 14 on its backside, which eliminates the need for connecting a signal path on the wiring pattern of circuit board 28. This contributes to simplified wiring pattern design of circuit board 28 on which the multiterminal-type static-electricity control part for multiple circuits is mounted. Further, prior to forming gap 19 between top electrodes 18 and top ground electrode 17, backside wiring 14 is formed by printing and baking. This eliminates variations in width of gap 19 between top electrodes 18 and top ground electrode 17 caused by heat generated in the printing and baking process of backside wiring 14. Such structured multiterminal-type static-electricity control part for multiple circuits offers reliable operations.

Instead of backside wiring 14, a plurality of resistors may be disposed on the backside of the static-electricity control part of the embodiment. As in the case of backside wiring 14, forming multiple resistors by printing and baking eliminates the need for connecting a signal path on the wiring pattern of circuit board 28. That is, the structure with multiple resistors is also effective in contributing to simplified wiring pattern design of circuit board 28 on which the multiterminal-type static-electricity control part for multiple circuits is mounted. In the structure above, the resistance value of a resistor should preferably be $10\Omega$ or less in terms of power consumption and high-speed signal transmission.

Although the description in the embodiment is given on an example where the sheet-like insulating substrate is divided into each piece by dicing, it is not limited thereto. For example, a sheet-like insulating substrate already having horizontally and vertically dividing grooves may be used. In this case, after the function elements have been formed, the insulating substrate is divided into pieces with application of a stress.

Second Exemplary Embodiment

Hereinafter will be described a process for manufacturing a static-electricity control part in accordance with the second exemplary embodiment of the present invention.

Each of FIGS. 6A through 6C, 7A through 7C is a plan view showing a step of the process for manufacturing a static-electricity control part in accordance with the second exemplary embodiment of the present invention. FIGS. 6A through 6C, 7A through 7C show a top view or a backside view of a partly-finished each piece to be formed into a multiterminal-type static-electricity control part for multiple circuits. In a real-world manufacturing process, however, aforementioned each piece is the one of a series of partly-finished pieces arranged in a matrix on a sheet-like insulating substrate.

Figure 6A:
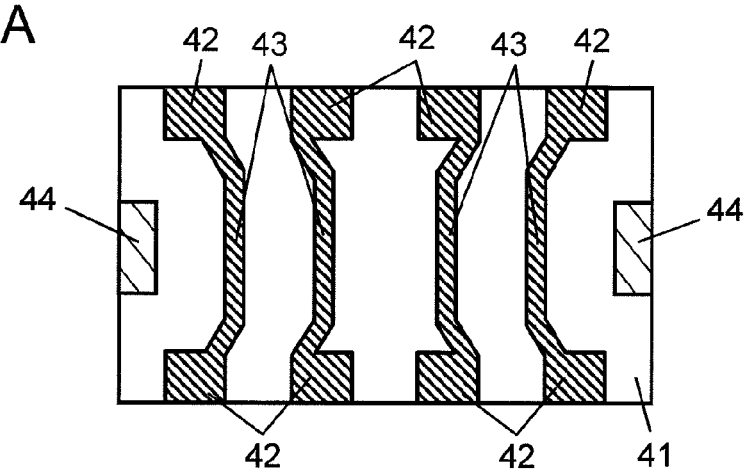
FIG. 6A is a plan view showing a step of the process for manufacturing the static-electricity control part in accordance with a second exemplary embodiment of the present invention.

Insulating substrate 41 shown in FIG. 6A is so structured that alumina or other low-dielectric materials having a dielectric constant lower than 50, preferably lower than 10 is baked at, for example, a temperature in the range of 900° C. to 1600° C. FIG. 6A shows a step where multiple backside electrodes 42, backside wiring 43, and backside ground electrode 44 are formed by screen-printing and baking silver paste or silver-palladium paste on the backside of insulating substrate 41. Although backside electrodes 42, backside wiring 43 and backside ground electrode 44 are formed by screen-printing and baking with the use of silver paste or silver-palladium paste in the process above, it is not limited to; they may be formed by printing and baking a material predominantly composed of gold, such as gold resinate paste, on the insulating substrate. In a case where a material predominantly composed of gold is employed for backside electrodes 42, backside wiring 43 and backside ground electrode 44, an overlaid backside electrode is formed over backside electrodes 42 and backside ground electrode 44 as protective measures against solder leach of gold. The overlaid backside electrode is made of mixture paste of curing resin and silver.

Figure 6B:
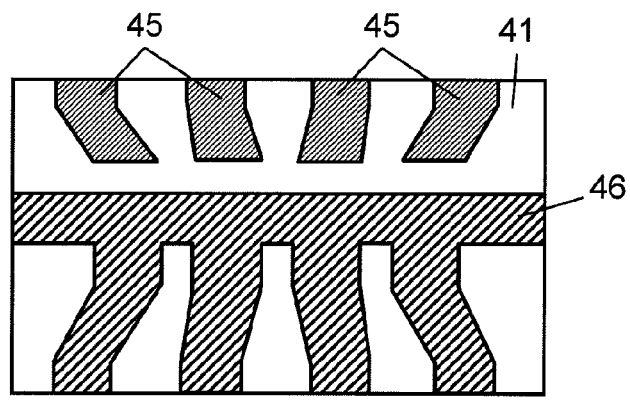
FIG. 6B is a plan view showing a step of the process for manufacturing the static-electricity control part in accordance with the second exemplary embodiment of the present invention.

FIG. 6B shows a step where top electrodes 45 and conductor 46 are formed by screen-printing and baking gold resinate paste on the top face of insulating substrate 41. Each thickness after baking of top electrodes 45 and conductor 46 is, for example, in the range of 0.2 μm to 2.0 μm. The thin structure of them protects metal to be formed into an electrode from having burrs, offering consistent dimensions and shapes.

Figure 6C:
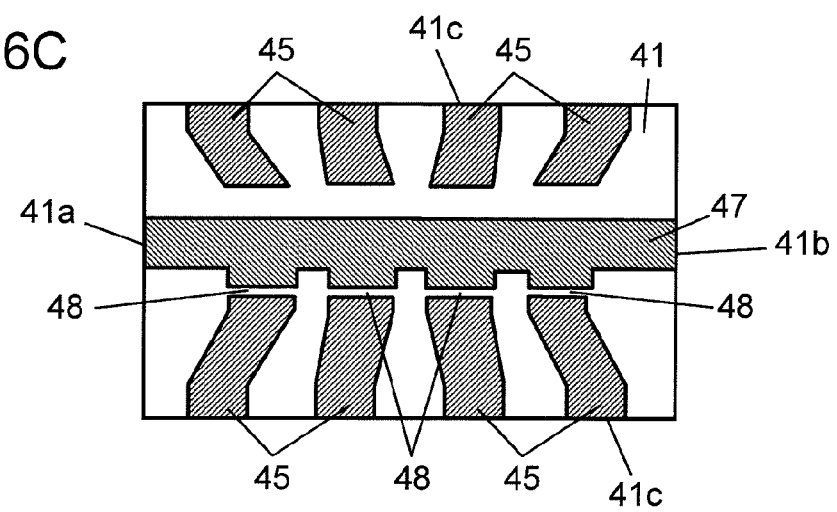
FIG. 6C is a plan view showing a step of the process for manufacturing the static-electricity control part in accordance with the second exemplary embodiment of the present invention.

Next, as shown in FIG. 6C, an unnecessary portion of conductor 46 is cut and removed by UV laser or the like. Through the step above, top ground electrode 47, multiple top electrodes 45, and gap 48 are formed on insulating substrate 41. Top ground electrode 47 runs from short-edge-side one end portion 41a through a middle portion to other end portion 41b. The multiple top electrodes 45 are located on any one of long-edge-side both end portions 41c. Gap 48, which has a width of approx. 10 μm, is provided between top electrodes 45 and top ground electrode 47. Gap 48 is not necessarily formed by the aforementioned UV laser cutting; dicing or other cutting may be employed for forming gap 48.

Figure 7A:
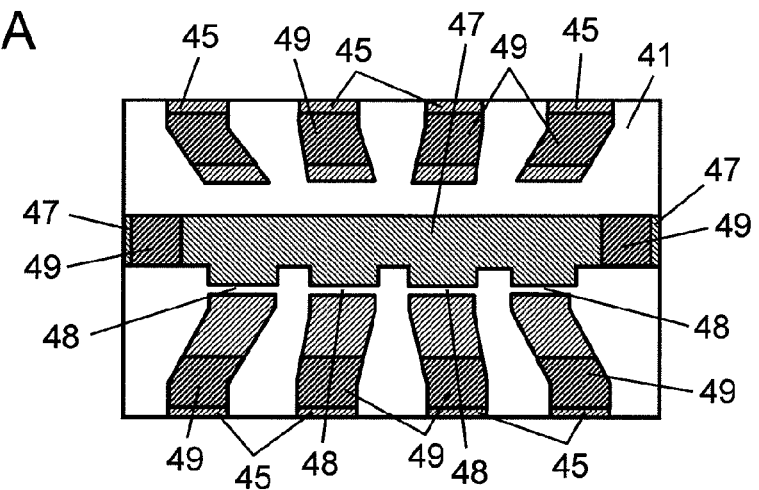
FIG. 7A is a plan view showing a step of the process for manufacturing the static-electricity control part in accordance with the second exemplary embodiment of the present invention.

Next, FIG. 7A shows a step where overlaid top electrode 49 made of mixture paste of resin and silver is formed with a thickness, for example, in the range of 3 μm to 20 μm, by screen-printing so as to cover a part of top electrodes 45 and top ground electrode 47 and so as not to cover the edges (not shown) of insulating substrate 41. The printed mixture paste is dried at a temperature in the range of 100° C. to 200° C. for a period in the range of 5 to 15 minutes. Such formed overlaid top electrode 49 is for protecting top electrodes 45 and top ground electrode 47 predominantly composed of gold from solder leach. Overlaid top electrode 49 is formed on insulating substrate 41 so as not to cover the edges that serve as a first dividing line and a second dividing line and the periphery of the edges of the substrate.

Figure 7B:
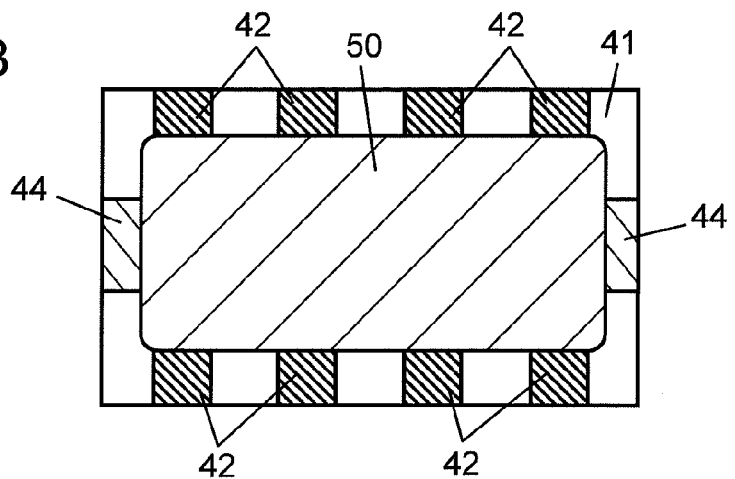
FIG. 7B is a plan view showing a step of the process for manufacturing the static-electricity control part in accordance with the second exemplary embodiment of the present invention.

FIG. 7B shows a step where backside protection resin layer 50 is formed on the backside of insulating substrate 41 by printing so as to completely cover backside wiring 43 (not shown).

Figure 7C:
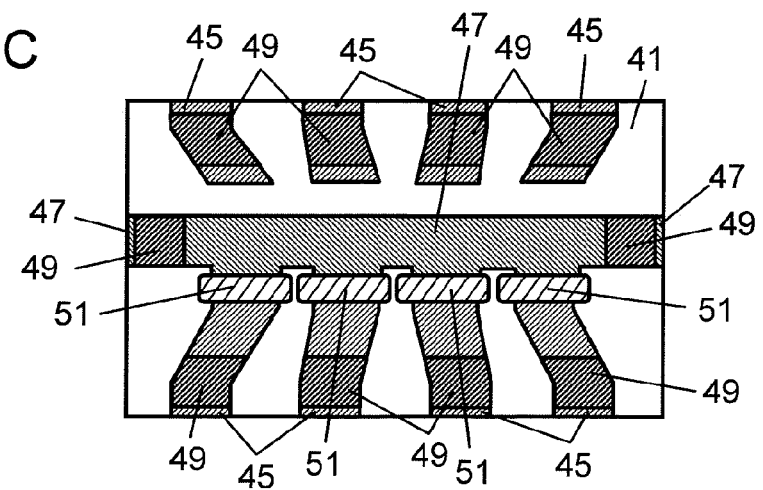
FIG. 7C is a plan view showing a step of the process for manufacturing the static-electricity control part in accordance with the second exemplary embodiment of the present invention.

FIG. 7C shows a step where overvoltage protection material paste is applied onto the top face of insulating substrate 41 so as to cover gap 48 (not shown) and top electrodes 45. The paste is formed, by screen-printing, into a thickness ranging, for example, from 5 μm to 50 μm. At the same time, the printed paste is dried at a temperature in the range of 150° C. to 200° C. for a period in the range of 5 to 15 minutes. Such formed overvoltage protection material layer 51 is separately disposed on each of top electrodes 45. The overvoltage protection material paste, which is formed into overvoltage protection material layer 51, is formed as follows: preparing a mixture of a metallic powder, which is formed of at least any one of Ni, Al, Ag, Pd and Cu, with an average particle diameter ranging from 0.3 μm to 10 μm and a spherical shape, and silicone-based resin such as methyl silicone; adding a suitable organic solvent to the mixture and kneading it well by a triple roll mill. In the step above, an intermediate layer (not shown), which has almost equal size to overvoltage protection material layer 51 disposed over gap 48 so as to completely cover layer 51, may be formed. In that case, intermediate-layer paste made of an insulating particle and methyl silicone is printed by screen-printing and dried. Preferably, the total thickness after drying of overvoltage protection material layer 51 and the intermediate layer should be 30 μm or greater so that electrostatic resistance satisfies predetermined conditions.

After the step above, a top-face protection resin layer, an imprint resin layer, an edge ground electrode, an edge electrode, a nickel-plated layer and a tinned layer are formed on the insulating substrate. The static-electricity control part of the second exemplary embodiment is thus completed. The steps of forming these components above are the same as those described in the first exemplary embodiment with reference to FIG. 3C and FIG. 4. Besides, the operating principle of the static-electricity control part of the second embodiment is also the same as that of the structure described in the first exemplary embodiment with reference to FIG. 5. Therefore, descriptions on these steps and the operating principles will be omitted.

In addition to the effect described in the first exemplary embodiment, the static-electricity control part of the second exemplary embodiment has a further advantage. In the embodiment, UV laser is employed for forming gap 48. The use of the UV laser achieves high accuracy in forming a width of gap 48 as narrow as 10 μm. Such structured multiterminal-type static-electricity control part for multiple circuits maintains stability of overvoltage protection characteristics.

Figure 8:
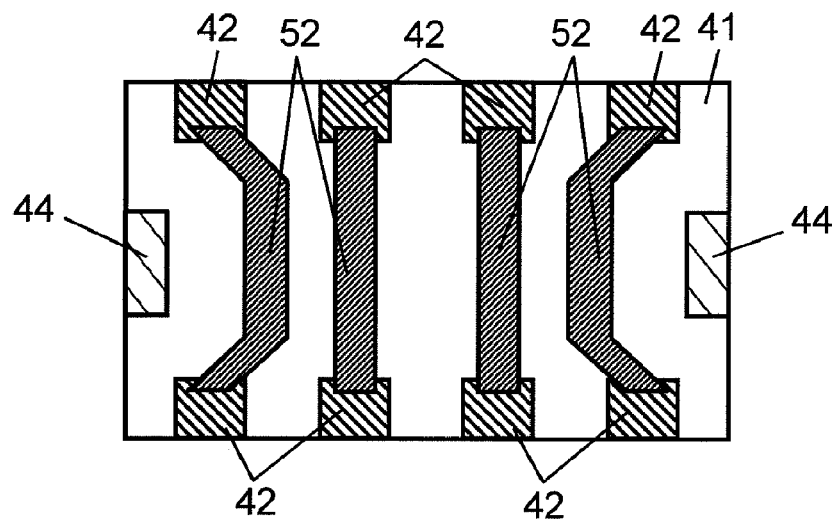
FIG. 8 is a plan view showing another structure of the static-electricity control part in accordance with the second exemplary embodiment of the present invention.
Figure 9:
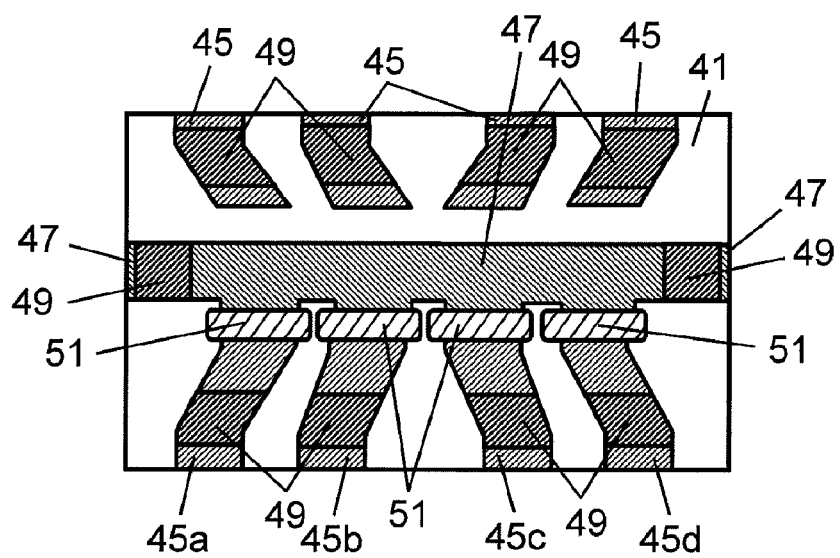
FIG. 9 is a plan view showing still another structure of the static-electricity control part in accordance with the second exemplary embodiment of the present invention.
Figure 10:
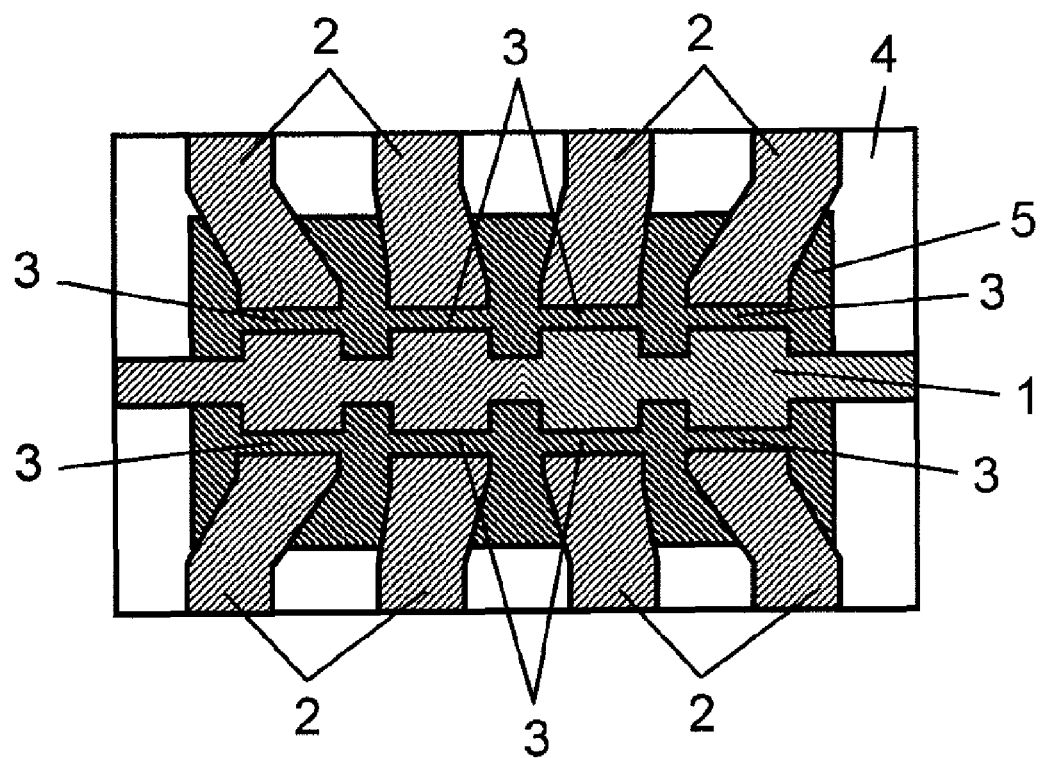
FIG. 10 is a plan view showing a partly-finished structure of a conventional static-electricity control part.

Each of FIGS. 8 and 9 shows another structure of the static-electricity control part in accordance with the second exemplary embodiment.

The second exemplary embodiment introduces an example where backside wiring 43 is formed on the backside of insulating substrate 41 for establishing electrical connections between multiple pairs of backside electrodes 42. Instead of backside wiring 43, as shown in FIG. 8, resistors 52 with a resistance value of 10Ω or less may be formed for establishing electrical connections between multiple pairs of backside electrodes 42. Resistors 52 cope with a decrease in impedance. Specifically, when a minute component of capacitive element of the static-electricity control part is fed into a high-speed transmission line, impedance decreases, degrading the quality of signal transmission. Forming resistors 52 reduces the ill effect due to decrease in impedance.

In the second exemplary embodiment, the description is given on a structure where top electrodes 45 are disposed at regular spacing on the long-edge side of insulating substrate 41. FIG. 9 shows another possible structure where top electrodes 45 are disposed in such a way that the spacing between electrodes 45 is determined wider in the middle of the long-edge side. In FIG. 9, top electrodes 45a and 45b are connected to a first data-line (not shown), on the other hand, top electrodes 45c and 45d are connected to a second data-line (not shown). In the structure above, the crosstalk effect is noticeable between top electrodes 45a, 45b connected to the first data-line and top electrodes 45c, 45d connected to the second data-line. Setting the spacing between top electrode 45b and top electrode 45c wider than that for other electrodes eases the crosstalk effect between the electrodes. Therefore, such structured multiterminal-type static-electricity control part used for multiple circuits maintains high signal quality and reliable operations. That is, suppressing the crosstalk effect is effective in enhancing stability and reliability of operations of a circuit and a component mounted thereon in a high-frequency circuit.

In the second exemplary embodiment, the description is given on a structure where top ground electrode 47 runs from short-edge-side one end portion 41a through a middle portion to other end portion 41b and the multiple pairs of top electrodes 45 are located on long-edge-side both end portions 41c. The electrode-layout is interchangeable with respect to the long-edge side and the short-edge side of the substrate. For example, the top ground electrode may be provided on the top face of insulating substrate 41 from its long-edge-side one end portion through a middle portion to other end portion; and the multiple pairs of top electrodes may be provided on the top face of insulating substrate 41 at its short-edge-side both end portions.

The structure above allows top ground electrode 47 to be formed wide. This is suitable for a circuit in which top ground electrode 47 can carry large current due to application of static electricity with extremely high voltage.

INDUSTRIAL APPLICABILITY

According to the static-electricity control part of the present invention, when multiple top electrodes are connected to multiple signal terminals of an integrated circuit, the structure above suppresses crosstalk effect between adjacent signal terminals. In particular, when the structure is employed for a multiterminal-type static-electricity control part for multiple circuits that protects an integrated-circuit element from static damage, preferable effect, such as improvement in reliability, is expected.

The invention claimed is:
1. A static-electricity control part comprising:
   multiple pairs of backside electrodes provided on both end portions of a long-edge-side at a backside of an insulating substrate;
   multiple pairs of top electrodes provided on both end portions of a long-edge-side at a top face of the insulating substrate;
   multiple pairs of edge electrodes provided on an edge of the insulating substrate so as to connect electrically between the multiple pairs of top electrodes and the multiple pairs of backside electrodes;
   a top ground electrode provided from one end portion to other end portion of a short-edge-side at the top face of the insulating substrate;

a pair of edge ground electrodes provided on an edge of the insulating substrate and electrically connected to the top ground electrode;

a gap formed between any one of the multiple pairs of top electrodes and the top ground electrode;

an overvoltage protection material layer for filling the gap;

a top-face protection resin layer for completely covering the overvoltage protection material layer; and a backside wiring provided on the backside of the insulating substrate so as to connect between the multiple pairs of backside electrodes.

2. A static-electricity control part comprising:

multiple pairs of backside electrodes provided on both end portions of a long-edge-side at a backside of an insulating substrate;

multiple pairs of top electrodes provided on both end potions of a long-edge-side at a top face of the insulating substrate;

multiple pairs of edge electrodes provided on an edge of the insulating substrate so as to connect electrically between the multiple pairs of top electrodes and the multiple pairs of backside electrodes;

a top ground electrode provided from one end portion to other end portion of a short-edge-side at the top face of the insulating substrate;

a pair of edge ground electrodes provided on an edge of the insulating substrate and electrically connected to the top ground electrode;

a gap formed between any one of the multiple pairs of top electrodes and the top ground electrode;

an overvoltage protection material layer for filling the gap; and a top-face protection resin layer for completely covering the overvoltage protection material layer; and a plurality of resistors provided on the backside of the insulating substrate so as to connect between the multiple pairs of backside electrodes.

3. A process for manufacturing a static-electricity control part comprising:

printing and baking multiple pairs of backside electrodes on both end portions of a long-edge-side at a backside of an insulating substrate;

forming a conductor predominantly composed of gold on a top face of the insulating substrate;

removing an unnecessary portion of the conductor for forming multiple pairs of top electrodes provided at both end portions of a long-edge-side of the top face of the insulating substrate and for forming a top ground electrode provided from one end portion to other end portion of a short-edge-side at the top face of the insulating substrate so as to face any one of the multiple pairs of top electrodes via a gap;

forming an overvoltage protection material layer for filling the gap;

forming a top-face protection resin layer for completely covering the overvoltage protection material layer;

forming an edge electrode on an edge of the insulating substrate so as to electrically connect between the multiple pairs of top electrodes and the multiple pairs of backside electrodes;

forming an edge ground electrode on an edge of the insulating substrate so as to be electrically connected to the top ground electrode; and forming a backside wiring on the backside of the insulating substrate so as to connect between the multiple pairs of backside electrodes.

4. A process for manufacturing a static-electricity control part comprising:

printing and baking multiple pairs of backside electrodes on both end portions of a long-edge-side at a backside of an insulating substrate;

forming a conductor predominantly composed of gold on a top face of the insulating substrate;

removing an unnecessary portion of the conductor for forming multiple pairs of top electrodes provided at both end portions of a long-edge-side of the top face of the insulating substrate and for forming a top ground electrode provided from one end portion to other end portion of a short-edge-side at the top face of the insulating substrate so as to face any one of the multiple pairs of top electrodes via a gap;

forming an overvoltage protection material layer for filling the gap;

forming a top-face protection resin layer for completely covering the overvoltage protection material layer;

forming an edge electrode on an edge of the insulating substrate so as to electrically connect between the multiple pairs of top electrodes and the multiple pairs of backside electrodes;

forming an edge ground electrode on an edge of the insulating substrate so as to be electrically connected to the top ground electrode; and forming a plurality of resistors on the backside of the insulating substrate so as to connect between the multiple pairs of backside electrodes.

* * * * *